United States Patent
Haapoja (10) Patent No.: US 7,653,365 B2
(45) Date of Patent: Jan. 26, 2010

(54) METHOD FOR CONTROLLING SIGNAL POWER IN TRANSMITTER OF RADIO SYSTEM BY WEIGHTING, AND TRANSMITTER THEREFOR

(75) Inventor: Sami Haapoja, Helsinki (FI)

(73) Assignee: Nokia Corporation, Espoo (FI)

( * ) Notice: Subject to any disclaimer, the term of this patent is extended or adjusted under 35 U.S.C. 154(b) by 1267 days.

(21) Appl. No.: 10/443,928

(22) Filed: May 22, 2003

(65) Prior Publication Data

US 2003/0228877 A1  Dec. 11, 2003

(30) Foreign Application Priority Data

May 27, 2002  (FI) .................................. 20020990

(51) Int. Cl.
*H01Q 11/12* (2006.01)
*H04B 1/04* (2006.01)

(52) U.S. Cl. ................. 455/127.1; 455/522; 455/114.3; 455/127.3

(58) Field of Classification Search ................. 455/522, 455/95, 110, 118, 114.2–114.3, 115.1, 127.1–127.5, 455/194.2, 253.2, 311, 341, 194.4; 375/295, 375/297, 300, 302, 303; 330/199, 127
See application file for complete search history.

(56) References Cited

U.S. PATENT DOCUMENTS

| | | | | |
|---|---|---|---|---|
| 4,380,089 A | * | 4/1983 | Weir | ................ 455/127.1 |
| 4,442,407 A | * | 4/1984 | Apel | ................ 330/128 |
| 5,511,234 A | * | 4/1996 | Ha | ................ 455/127.2 |
| 5,826,177 A | * | 10/1998 | Uno | ................ 455/126 |
| 5,977,833 A | * | 11/1999 | Attimont et al. | ........... 330/297 |
| 6,054,896 A | * | 4/2000 | Wright et al. | ............ 330/149 |
| 6,160,449 A | * | 12/2000 | Klomsdorf et al. | ......... 330/149 |
| 6,175,586 B1 | * | 1/2001 | Lomp | ................ 375/130 |
| 6,405,054 B1 | * | 6/2002 | Rozenblit et al. | ........... 455/522 |
| 6,434,373 B2 | * | 8/2002 | Ichihara | ................ 455/127.5 |
| 6,633,766 B1 | * | 10/2003 | van der Pol | ............ 455/522 |
| 6,741,867 B1 | * | 5/2004 | Tetsuya | ................ 455/522 |
| 6,868,075 B1 | * | 3/2005 | Narvinger et al. | ......... 370/335 |
| 6,973,334 B2 | * | 12/2005 | Katagishi et al. | ........... 455/571 |
| 2002/0080728 A1 | * | 6/2002 | Sugar et al. | ................ 370/252 |

FOREIGN PATENT DOCUMENTS

| | | |
|---|---|---|
| WO | WO 00/48306 | 8/2000 |
| WO | WO 01/50632 | 7/2001 |

* cited by examiner

*Primary Examiner*—Matthew D Anderson
*Assistant Examiner*—Shaima Q Aminzay
(74) *Attorney, Agent, or Firm*—Hollingsworth & Funk, LLC (57) ABSTRACT

The invention relates to a method and a transmitter implementing the method, wherein signal errors caused by high-rate power control commands are eliminated. The invention is based on weighting a signal to be supplied to an amplifier while the gain of a power amplifier is in a transition state.

16 Claims, 5 Drawing Sheets

METHOD FOR CONTROLLING SIGNAL POWER IN TRANSMITTER OF RADIO SYSTEM BY WEIGHTING, AND TRANSMITTER THEREFOR

FIELD

The invention relates to a method for controlling signal power in a transmitter of a radio system, and to a transmitter of a radio system.

BACKGROUND

As wireless telecommunication systems become more and more common, the aim is to increase the performance of radio systems as close to a theoretical maximum as possible. In this development work, the dynamics of the transmission power of transmitters plays an important role. The required transmission power of a transmitter may change due to external reasons, such as a change in the radio transmission path between the radio transmitter and a receiver or when the radio transmitter starts or stops transmitting an active time slot.

Good transmission power dynamics of radio systems requires that the output power of power amplifiers of transmitters should be provided with a wide operating range. It is typical for the power amplifiers used in radio systems that high output power of a power amplifier provides good efficiency but, at the same time, the linearity of the power amplifier is reduced. A power amplifier operating at a good efficiency level thus causes non-linear distortion to an amplified signal or, alternatively, a power amplifier operating within a linear range operates at a poor efficiency level, wasting power.

In the prior art solutions, a transmitter may operate at two or more power levels that are determined according to the transmission power needed. The power levels are provided by changing the power of a signal supplied to the power amplifier, and simultaneously optimizing the operating point of the power amplifier in order to minimize power consumption. A drawback of the prior art solutions is the slow response of the element used for controlling the operating voltage of a power amplifier and the resulting delay in achieving the desired amplification of the power amplifier in proportion to the necessary rate of change in the transmission power. The delayed amplification of the power amplifier causes distortions in the amplified signal, impairing the performance of a radio system.

BRIEF DESCRIPTION

An object of the invention is to provide an improved method and an improved radio system for controlling signal power.

An aspect of the invention is a method for controlling signal power in a transmitter of a radio system, the method comprising generating an amplified signal by amplifying a signal at a power amplifier, changing the effective value of the amplified signal by modifying the operating voltage of the power amplifier and, as the operating voltage changes, by weighting the signal such that the effective value of the amplified signal remains within a predetermined value range.

An aspect of the invention is a transmitter comprising signal source for generating a signal, a power amplifier connected to the signal source for generating an amplified signal from the signal, and a power source for providing an operating voltage for the power amplifier; the power source is configured to change the operating voltage of the power amplifier, the power amplifier is configured to change the amplification as the operating voltage of the power amplifier changes, and the signal source is configured to weight the signal as the amplification of the power amplifier changes such that the effective value of the amplified signal remains within a predetermined value range.

Preferred embodiments of the invention are disclosed in the dependent claims.

The idea underlying the invention is that when the amplification of a power amplifier is modified by changing the operating voltage of the power amplifier, the delay in the amplification of the power amplifier is compensated for by modifying a signal to be amplified such that the effective value of the amplified signal resides within desired limits.

The invention provides several advantages. For example, the invention enables distortions to be efficiently eliminated from amplified signals. Furthermore, the present solution enables some embodiments to be implemented by processor programming.

LIST OF DRAWINGS

The invention is now described in closer detail in connection with the preferred embodiments and with reference to the accompanying drawings, in which.

DESCRIPTION OF EMBODIMENTS

Figure 1:
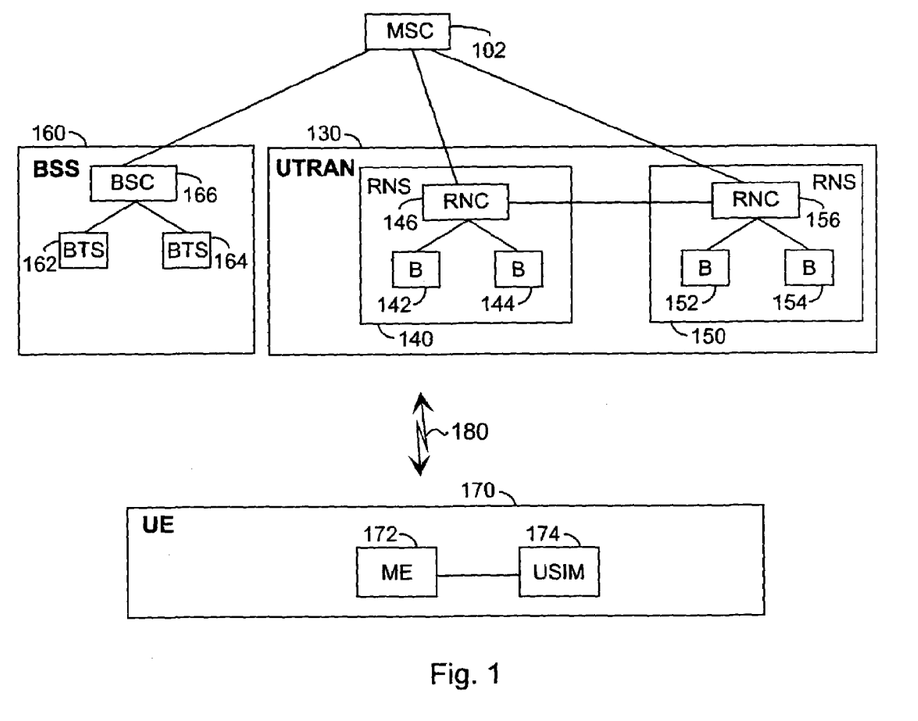
FIG. 1 shows an example of the structure of a radio system.

First, examine FIG. 1 showing an example of a radio system to which the present solution can be applied. Being widely known per se, the structure and operation of the network elements are described in a limited manner.

A radio system comprises a radio-dependent layer and a radio-independent layer. An example of a radio-independent layer is a mobile service switching centre (MSC) 102, which is the centre point of the circuit-switched side of a core network. The tasks of the mobile services switching centre 102 include, for example: switching, paging, user equipment location registration, handover management, collection of subscriber billing information, encryption parameter management, frequency allocation management, and echo cancellation.

Radio systems are represented by a first radio system, i.e. a radio access network called UTRAN 130 and a second radio system, i.e. a base station system (BSS) 160. The term UTRAN is short for UMTS (Universal Mobile Telephone System) Terrestrial Radio Access Network, i.e. the radio access network 130 is implemented by wideband code division multiple access (WCDMA) technology. The figure further shows user equipment (UE) 170, which can establish a radio connection 180 to the radio access network 130 or to the base station system 160, or both. The base station system 160 is implemented by time division multiple access (TDMA) technology.

The first radio system, i.e. the radio access network 130, comprises radio network subsystems (RNS) 140, 150. Each radio network subsystem 140, 150 comprises radio network controllers (RNC) 146, 156 and nodes B 142, 144, 152, 154. Since node B is a rather abstract concept, the term "base transceiver station" is often used instead.

The radio network controller 146 controls nodes B 142, 144 subordinate thereto. In principle, the aim is that devices and the related functions implementing a radio path reside in nodes B 142, 144 while control devices reside in the base station controller 146.

The radio network controller 146 is responsible for the following tasks, for instance: radio resource management of nodes B 142, 144, inter-cell handovers, frequency control, i.e. frequency allocation to nodes B 142, 144, management of frequency hopping sequences, time delay measurement on the uplink, and power control.

Node B 142, 144 comprises at least one transceiver, which is used for implementing a WCDMA radio interface. Typically, node B serves at least one cell that can be divided into sectors. The diameter of a cell may range between few meters and a dozen of kilometers. The tasks of node B 142, 144 include, for example: calculation of timing advance (TA), uplink measurements, channel coding, encryption, decryption, and frequency hopping.

The second radio system, i.e. the base station system 160, comprises a base station controller (BSC) 166 and base transceiver stations (BTS) 162, 164. The base station controller 166 controls the base transceiver station 162, 164. The base station controller 166 is responsible for substantially the same tasks as the radio network controller 146.

The base transceiver station 162, 164 comprises at least one transceiver, and each carrier wave thereof comprises eight time slots, i.e. the transceiver implements eight physical channels on each carrier wave. Typically, one base transceiver station 162, 164 serves one cell, which can be sectored. The tasks of the base transceiver station 162, 164 include similar ones to those of node B.

The user equipment 170 comprises two parts: mobile equipment (ME) 172 and a UMTS subscriber identity module (USIM) 174. The USIM 174 comprises user-related information, and information related to information security in particular, for instance an encryption algorithm. The user equipment 170 comprises at least one transceiver for establishing a radio link to the radio access network 130 or to the base station system 160. The user equipment 170 may comprise at least two different subscriber identity modules. The user equipment 170 further comprises an antenna, a user interface and a battery.

Figure 2:
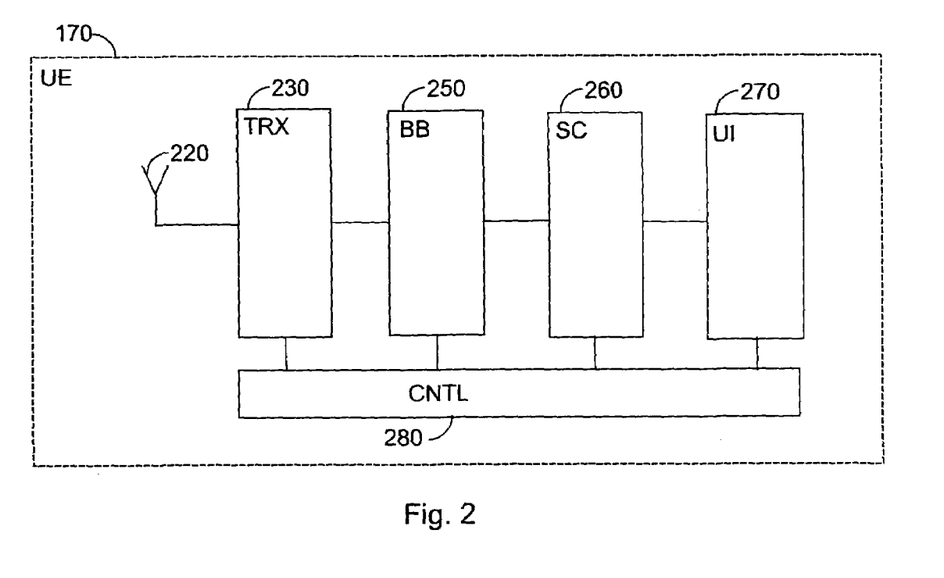
FIG. 2 shows an example of the structure of terminal equipment in a radio system.

FIG. 2 is a block diagram showing the structure of the user equipment 170. The user equipment 170 comprises a user interface (UI) 270, a source codec unit (SC) 260, a baseband unit (BB) 250, a transceiver 230, an antenna 220, and a control unit 280.

The user interface 270 of the user equipment 170 comprises e.g. a keypad and audiovisual devices, such as a display, microphones and earphones. The source codec unit 260 performs source encoding and digital signal processing.

The baseband unit 250 comprises signal processors and the necessary memory means for processing the signals to be transmitted to and received from the transceiver 230. The tasks carried out at the baseband unit 250 include e.g. digital signal weighting of the user equipment 170. The tasks that can be carried out at the baseband unit 250 further include spreading a signal to be transmitted and despreading a received signal.

The transceiver 230 converts a received radio-frequency signal into a baseband one and a baseband signal to be transmitted into a radio-frequency one. The transceiver 230 further comprises amplifiers for amplifying signals to be transmitted from and signals received by the antenna 220. The transceiver 230 also comprises duplex filters for separating a signal to be transmitted and a signal to be received.

Figure 3:
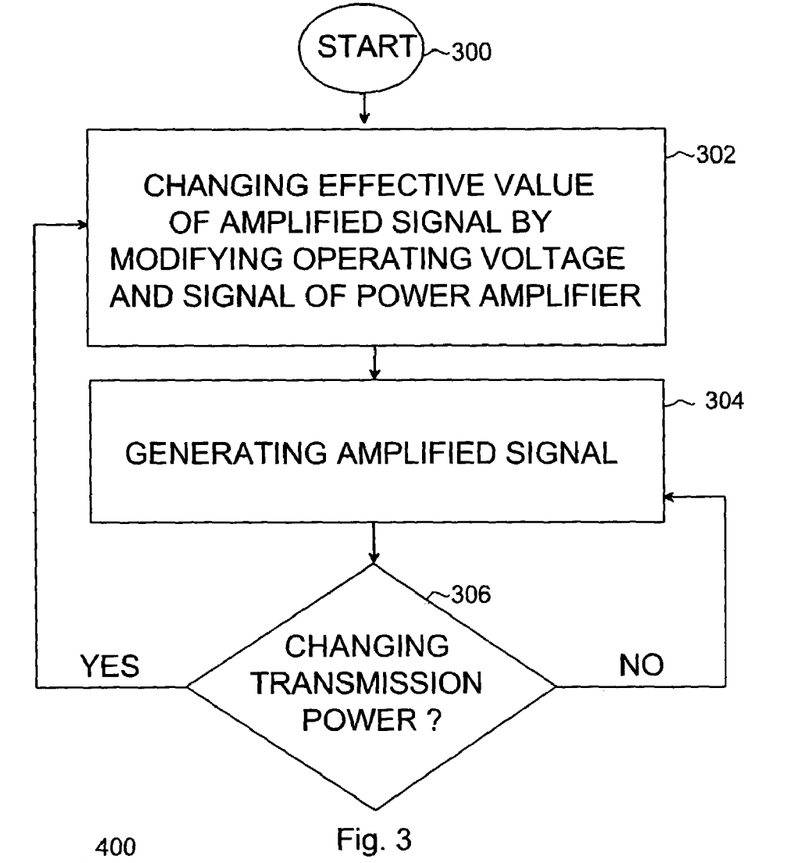
FIG. 3 is a flow diagram illustrating a method for controlling signal power.
Figure 4:
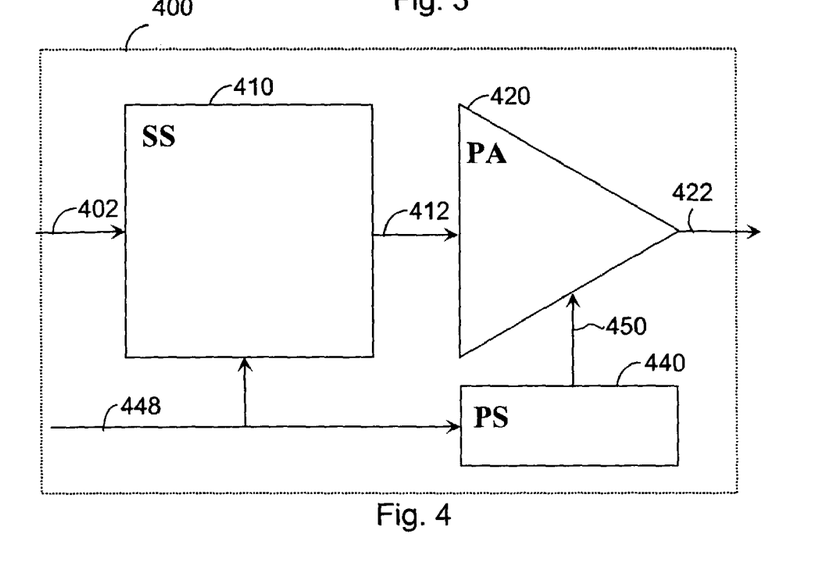
FIG. 4 is a simplified block diagram showing the structure of a transmitter.

The control unit 280 controls the operation of the transceiver 230, the baseband unit 250 and the source codec unit 260, and it is usually implemented as a processor with the related software; however, different hardware implementations, e.g. a circuit constructed from separate logic components or one or more application-specific integrated circuits (ASIC), are also possible. A hybrid of these different implementations is also possible. The control unit 280 gives e.g. the transceiver 230 and the baseband unit 250 control commands specifying the signal weighting, and baseband unit 250 implements digital signal weighting on the basis of these commands. In an embodiment, the transceiver 230 comprises an adjustable amplifier for carrying out normal ramping related to normal signal power control, controlled by the control unit 280. The weighting in accordance with the present solution can then be carried out by modifying the normal ramp. The control unit 280 is also responsible for so-called higher level signalling, which relates e.g. to connection setup and maintenance and to resource allocation. Examine the presented solution in greater detail by means of FIGS. 3 and 4. FIG. 3 shows a method for controlling signal power, and FIG. 4 is a block diagram showing a simplified transmitter 400. The transmitter 400 may reside at the user equipment 170 or at a base transceiver station 162, 164, 142, 144, 152, 154 of a fixed network. The transmitter 400 comprises a signal source 410, a power amplifier 420 and a power source 440. The signal source 410 comprises the transceiver unit 230 and the baseband unit 250 e.g. of the user equipment 170 shown in FIG. 2, but a similar structure can also be applied to a base transceiver station of a radio system. The power amplifier 420 may be e.g. any of the prior art Type A, Type B, Type AB or Type E power amplifiers; as far as the present solution is concerned, a feature of these power amplifiers is that the amplification of the power amplifier 420 depends on the operating voltage 450 fed into the power amplifier 420, the operating voltage determining the operating point of the power amplifier. The power amplifier 420 amplifies a signal 412 into an amplified signal 422, which can further be filtered and conveyed to an antenna of the transmitter 400. The amplified signal 422 has an effective value, also called a mean value, which can be determined e.g. according to the radio system standard to be applied. In the WCDMA standard, for example, signal power is determined as an average power during one time period (667 µs) when the measurement is carried out by a filter whose response follows the response of a square-root raised cosine filter, the roll off α of the response being 0.22 and the chip rate being the same as the chip rate of a spread signal.

Figure 6:
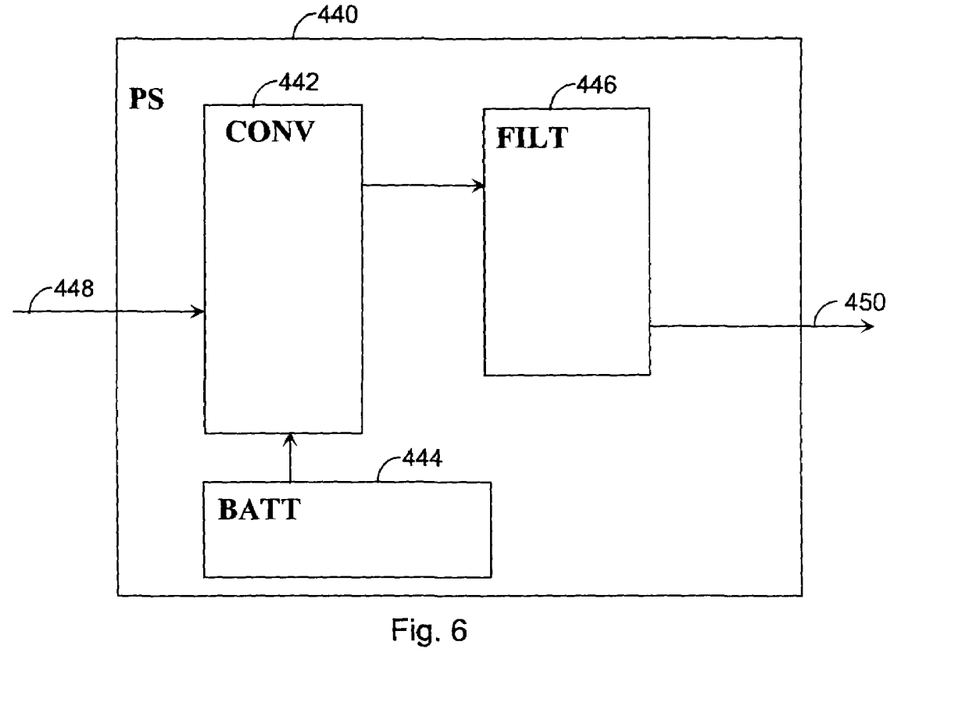
FIG. 6 is an example of the structure of a power source of a transmitter.

FIG. 6 shows an example of the power source 440 of the power amplifier 420. The power source 440 comprises a converter 442, which can be e.g. a direct current/direct current (DCDC) type converter. A constant-voltage source, such as a battery 444, provides the converter 442 with its operating power, the converter 442 converting the electromotive force generated by the battery 444 into an appropriate form for the power amplifier 420. The power source 440 further comprises a filter 446, which can be implemented by passive components, using e.g. CL (C=capacitance and L=inductance) type circuits. The filter 446 attenuates ripple voltages generated at the converter 442, and when such ripple voltages get into the operating voltage of the power amplifier 420, they may cause interference to the amplification of the power amplifier 420, and thus to the signal 442. The above-described power source 440 connected to the power amplifier 420 constitutes a combination which, by changing the voltage generated by the power source 440, enables the operating point of the power amplifier 420 to be efficiently adjusted such that the power amplifier 440 operates as close to the optimal range as possible at the desired effective values of the amplified signal 422 in terms of linearity and efficiency. In an embodiment, the voltage 450 provided by the power source 440 can be modified on the basis of a power control request 448 directed at the power source 440. The power control request 448 thus modifies the output voltage 450 of the DCDC converter, thus changing the conversion ratio between the input voltage of the converter 442 generated by the battery 444 and the output voltage 450 generated by the converter 442. A change in the conversion ratio requires a change in the effective value of the amplified signal 422, i.e. power control. It is also possible to control the DCDC converter by a signal directly proportional to the output 422 of the power amplifier. The signal 422 is then sampled e.g. by a directional coupler, and the sample is rectified and filtered to enable a DC voltage proportional to the output voltage 422 to be achieved, which is thus used for controlling the operating voltage 450 of the power amplifier 420. In an embodiment, the converter 442 is capable of generating two or more predetermined output voltages, the converter 442 being configured to generate one of these voltages at a time in accordance with the power control request 448. When, for example, the average power requirement of the signal 422 lies between 0 dBm and 21 dBm, the power control request 448 requests the power source 440 to change its output voltage to a voltage of 3.1 V, in which case the amplification of the power amplifier 420 can be of the order of 30 dB. Similarly, when the power requirement of the signal 422 lies between −50 dBm and 0 dBm, the power source 440 is configured to generate a 1.5 V voltage, which corresponds with a 25 dB amplification. A problem with the prior art power sources with high-efficiency output voltage control is the retardation of the power source with respect to a given power control request 448. This can be seen as a retardation of the change in the amplification of the power amplifier 420 and, eventually, as a slowness of the change in the power of the amplified signal 422 with respect to the power control request 448. The rise time of the converter 442 depends on the load current of the power amplifier 440, the total capacitance of the filter 446 and the total current generated by the converter 442. A short rise time requires a small load current of the power amplifier 420, small capacitance of the filter 446 and a high short-circuit current of the converter 442. The fall time of the converter 442, in turn, depends on the load current of the power amplifier 420 and the capacitance of the filter 446. A large load current forces the filter 446 to discharge more rapidly, which means that the fall time is short. Consequently, the simultaneous operation of the power source 440 both as an efficient ripple voltage filter and as a fast controller of the operating voltage of an amplifier is a difficult task to implement in practice.

Figure 5:
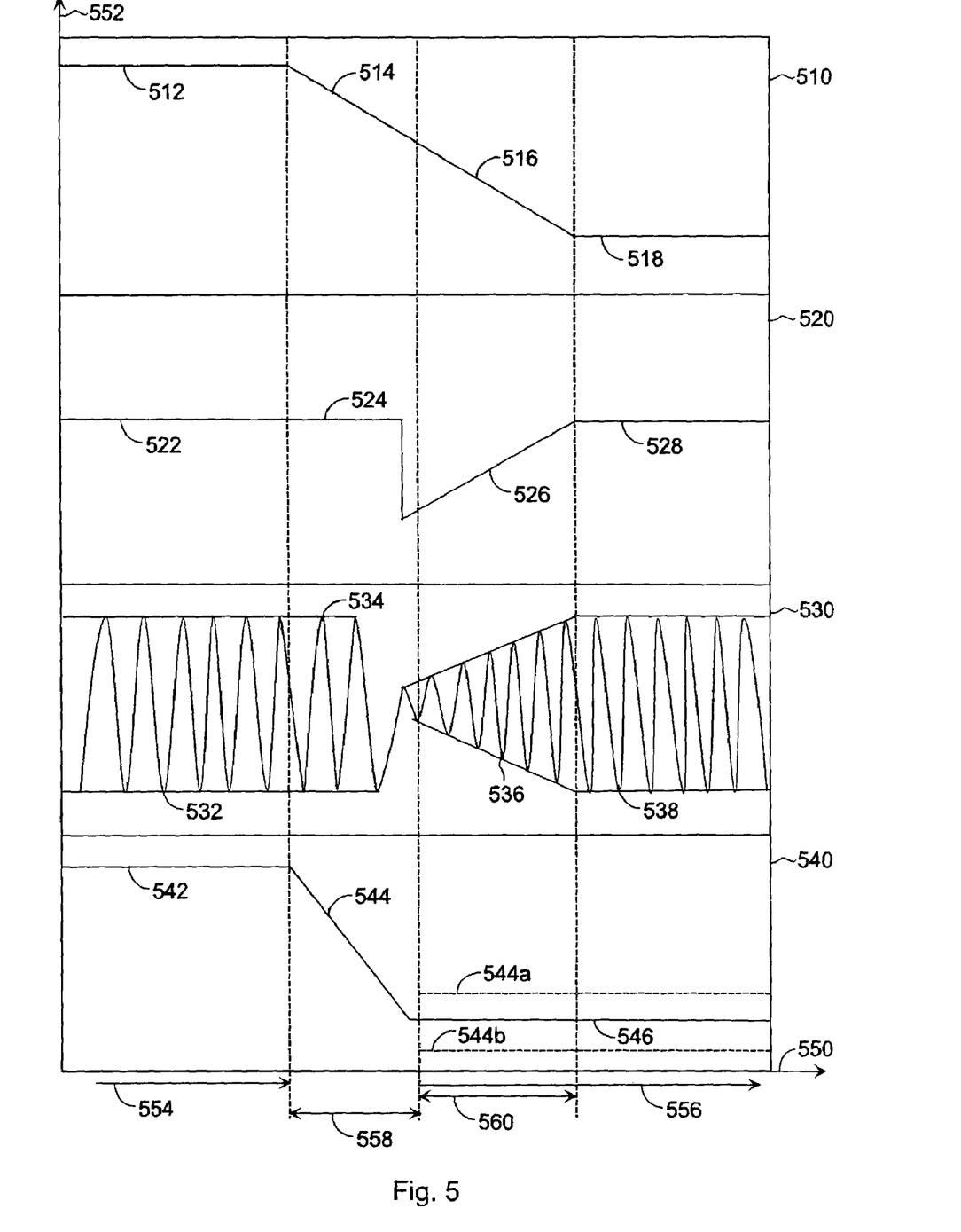
FIG. 5 is a signal diagram in accordance with an embodiment.

Examine an embodiment of the present solution by means of signal diagram 5. The diagram comprises blocks 510, 520, 530, 540, which all comprise a common horizontal axis 550 representing time. The unit of the horizontal axis 550 is a time unit, such as a microsecond, but the described scaling of the axis 550 per se is only suggestive. Block 510 shows an amplification curve of the power amplifier 420, block 520 shows a weighting curve to be applied to the signal 412, block 530 shows the weighted signal 412, and block 540 shows the effective value of the signal 422. The examination comprises three time periods 554, 556 and 558, period 554 being the first active period, period 556 being the second active period and period 558 being a guard period. Period 560 is a transition period during which the weighting in accordance with the presented solution takes place. During the active periods 554, 556, the signal 422 transmitted by the transmitter 400 has to meet the criteria established by the radio system that are determined e.g. by transmission powers or the compatibility of the wave form of a transmitted signal with a reference wave form. The latter is applied when error vector magnitude (EVM) is determined. In this example, the transmitter 400 transmits the signal in both active periods 554, 556, but a situation is also possible wherein transmission takes place during only one active period. As far as the present solution is concerned, however, the interesting point is the transition to the second active period 556. The guard period 558 may be e.g. a guard period specified by a radio system standard, during which the power of a transmitter is adjusted from one level to another. Typically, power must be controlled during the guard period 558 in accordance with a specific power window provided in the standard. The guard period 558 may be e.g. the 50 μs in accordance with the WCDMA standard, but the present solution also enables a considerably shorter duration for the guard period 558. FIG. 5 shows by way of example a weighting curve 524 possibly used during the guard period 558, a weighted signal 534 and the effective value 554 of the amplified signal 422, but the curves disclosed herein are irrelevant to the present solution.

First, examine blocks 510 and 540. Block 510 shows the power amplifier 420 gain during the shown time periods 554, 556, 558, 560. Block 540, in turn, shows the effective value 542 of the signal 422 in the first active period and the effective value 546 in the second active period 556 in a situation wherein the present solution has been applied. In this example, the power source 440 receives a power control command 448 to change the operating voltage 450 of the power amplifier 420, which results in the amplification of the power amplifier 420 changing from a value 512 to a value 518. In an ideal situation, a change in the effective value of the amplified signal 442 of the amplifier 400 is similar to that shown in block 540, in which case the effective value of the signal 422, immediately after the guard period 558 is over, settles within a predetermined value range confined by values 544a and 544b. The value range is determined e.g. by the standard of the radio system used and the magnitude of power change. For example, a 21 dB change in power allows for a 6 dB power deviation from a desired power value. It is to be noted that the standard of the radio system used may also comprise indirect criteria related e.g. to measuring modulation quality. In such a case, the value range 544a, 544b can be provided with stricter conditions at the beginning of the active period 556.

In FIG. 5, block 510 shows a transition in the amplification of the power amplifier 420 from amplification value 512 to amplification value 518. The transition comprises a transition guard period 514 and a transition end period 516. A finite transition time is caused by the above-described properties of the power source 440, such as the finite time constant of the filter 446. The transition end period 516 causes a prior art problem since the amplification has thus not achieved the required level to settle the effective value of the signal 422 within the desired value range 544a, 544b. The transition time may be e.g. 130 μs, the duration of the transition end period 518 thus being approximately 80 μs.

Block 520 in FIG. 5 shows an example of weighting the signal 412 in accordance with the present solution in order to compensate for the incorrect amplification during the transition end period 516. Weighting is also called ramping and, being typically inclined, an amplification curve is also known as a ramp. Block 530 shows a weighted signal 532, 536, 538, representing e.g. an output signal of I or Q branches of digital-analog converters of a transmitter. During the first active period 554 and during the time after the transition end period 516 of the second active period 556, parts 522, 528 of the weighting curve are close to unity. The signal 422 is then amplified at the power amplifier 420 without the weighting associated with the present solution. Weightings based on other reasons are possible, however. During the guard period 558, the weighting can be anything within the limits set by the radio system standard used. After the guard period 558 has ended, the weighting curve forms a ramp 526, which produces the weighted signal 536 whose weighting is a function of time. The effective value of the signal 422 weighted by the above-described weighting produces the curves 542, 546 according to block 540 wherein the effect of the transition end period 516 of the amplification is compensated for by weighting the signal 422 by the weighting curve 522, 526, 528.

The above-disclosed signal diagram also applies when the amplification of the power amplifier 420 changes such that the amplification is higher in the second active period 518 than in the first active period 512. On the basis of FIG. 5, the way in which the signal 422 is weighted is then obvious to one skilled in the art.

In an embodiment, the effective value of the amplified signal 422 is modified by changing the operating voltage 450 of the power amplifier 420 to be of predetermined values that are determined on the basis of the effective value of the signal 422. The changes in power may be e.g. the following ones: $\Delta P_1, \Delta P_2, \ldots \Delta P_N$, in which case each change in the power range corresponds with a different length and shape of the transition end period 516 of the amplification of the power amplification. Each change $\Delta P_i$ in the power range corresponds with a specific change in the operating voltage 450 of the power amplifier 420. The shape and length of the transition end period 516 are thus previously known, enabling the effective value of the amplified signal to be advantageously modified by weighting the signal using predetermined weighting coefficients. In an embodiment, each change in power $\Delta P_i$ corresponds with a set of weighting coefficients $W_i=(w_1, \ldots, w_k, \ldots, w_M)$ whose elements $w_k$ correspond with the weighting to be applied at each moment of the transition end period 516. In an embodiment, the set of weighting coefficients $W_i$ is selected on the basis of the power control command 448. Both the change in the operating voltage 450 carried out by the power source 440 and the weighting the signal 412 undergoes are then selected to correspond with each other.

In an embodiment, the weighting coefficients are located in the read only memory (ROM) of the control unit 280 of the transceiver 230. The process may proceed in the following manner, for example: the control unit 280 changes the power level of the transmitter from a higher level to a lower one, causing a change $\Delta P_1$ in the power of the amplified signal 422. At the same time, the control unit 280 also changes the operating voltage 450 of the power amplifier 420 from a higher level to a lower one. In the time domain, the power control and operating voltage control take place e.g. immediately at the beginning of the guard period 558. If, for example, measurements carried out in advance reveal that the change in power $\Delta P_1$ causes problems in accordance with block 510 in FIG. 2, such as too high non-linear distortion to the wave form of modulation, to the signal to be transmitted, coefficients in accordance with the weighting curve 526 described by block 520 in FIG. 2 are stored in the ROM memory in vector $W_1$. In such a case, using vector $W_1$, the transmission power of the transmitter can be modified during the transition period 560 to enable a situation in accordance with block 540 in FIG. 2 to be achieved. Vector $W_1$ can be used e.g. for modifying the amplitudes of I and Q signals at an IQ modulator or, similarly, for modifying the shape of the power ramp of the actual power control element of a transmitter. Similarly, the change in power $\Delta P_i$ may be provided with a vector $W_i$ of its own in the ROM memory. The power control command 448 is transmitted e.g. from the control unit 280 of the terminal equipment and it is caused e.g. by a power control request made by a base transceiver station to the terminal equipment in order for the base transceiver station to request, e.g. on the basis of power measurements conducted on the received signals, the terminal equipment to change the transmission power e.g. due to geographical obstructions or other factors affecting the radio connection. The power control command may also be generated at the terminal equipment itself e.g. at the outset of transmission or a transmission mode of a particular channel. In the WCDMA, for example, such a situation may occur when the terminal equipment starts transmitting data in compressed frames, using short time intervals. It is also possible that the power control command 448 is generated from a signal detected from the output of the power amplifier 420. The origin of the original power control command is, however, irrelevant to the present solution. Broadly understood, a power control signal is a signal on the basis of which the power source 440 and the device carrying out signal weighting perform power control. A power control command may be a previously known symbol sequence or, for example, a signal directly controlling the output voltage 450 of the power source 440. A power control command 448 may also contain the information to be used for signal weighting, either in digital or analog form. The information used for weighting comprises e.g. the numerical values of weighting coefficients or the voltage level which controls the weighting an analog signal is to undergo.

Figure 7:
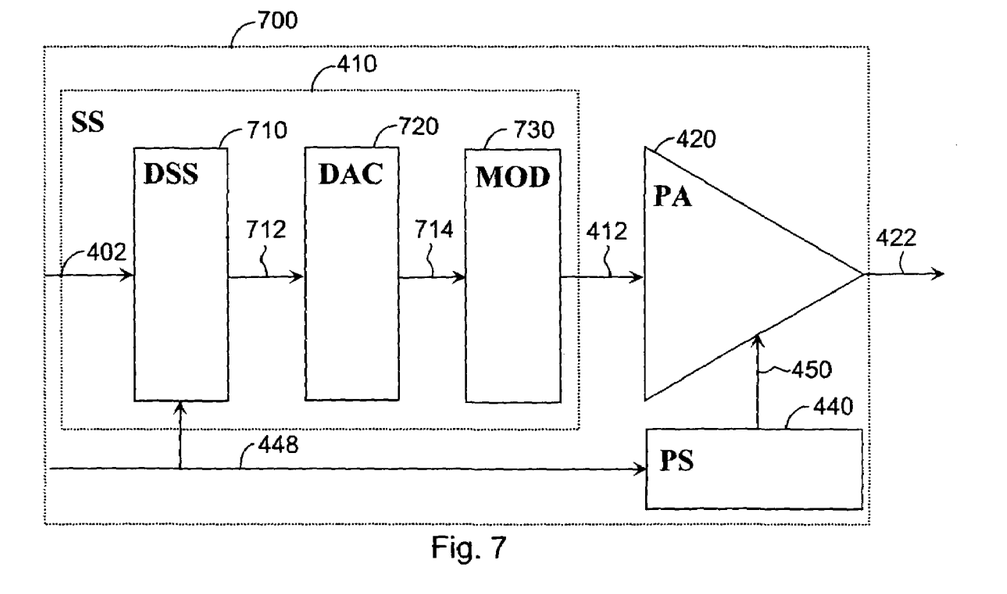
FIG. 7 shows an embodiment of a transmitter.
Figure 8:
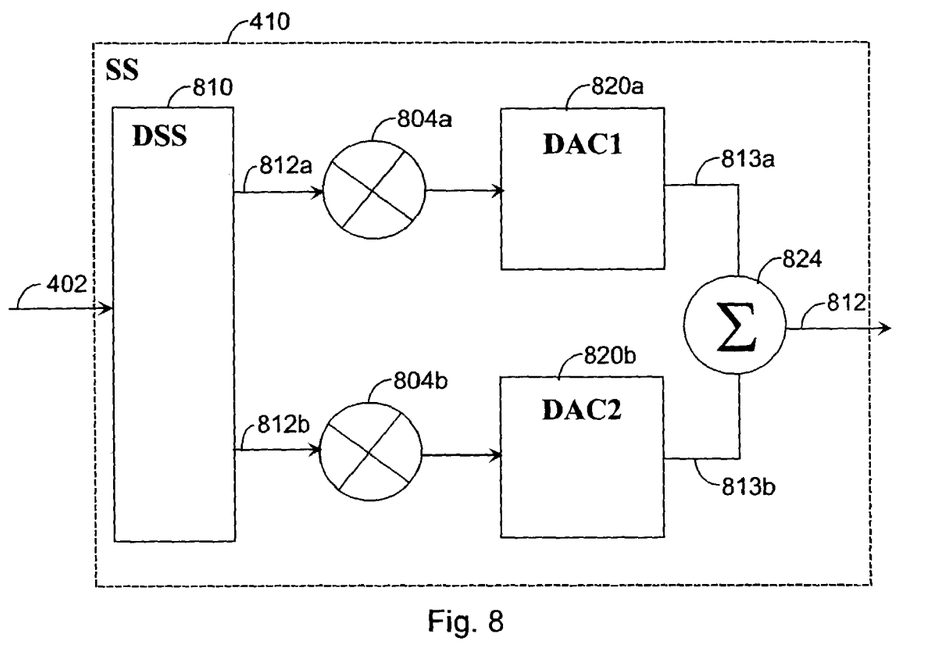
FIG. 8 shows an embodiment of a transmitter.
Figure 9:
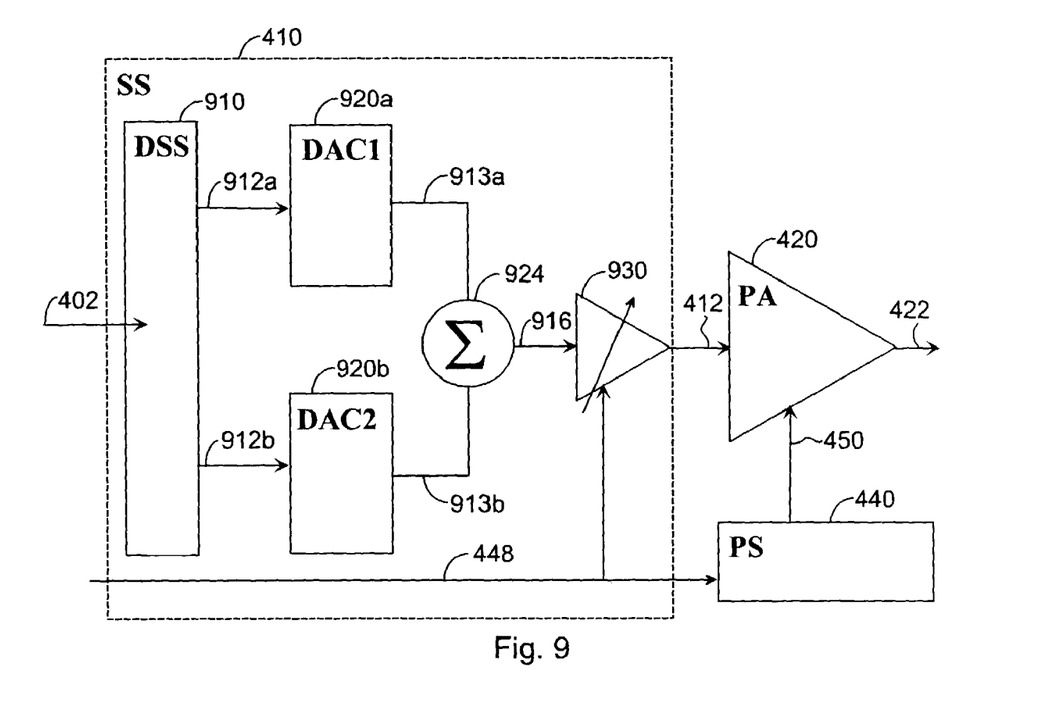
FIG. 9 shows another embodiment of a transmitter.

Next, examine embodiments of the present solution by means of FIGS. 7, 8 and 9. The embodiments to be shown follow the method diagram of FIG. 3, wherein the amplified signal 422 is formed by amplifying the signal 412 at the power amplifier 420 and wherein start block 300 comprises the first active period 554 disclosed in FIG. 5. Method diagram 3 comprises changing the effective value 542, 546 of the amplified signal 422 by modifying the operating voltage 450 of the power amplifier and by weighting the signal 412 during the active period 556 following the guard period 558 such that the effective value 546 of the amplified signal 422 remains within the predetermined value range 544a, 544b.

In the embodiments to be shown, it is assumed that the power control command 448 has been received at the power source 440, and that the transition end period 560 of the amplification disclosed in FIG. 3 is just about to begin. The power control command 448 also applies to the device carrying out the signal weighting. In such a case, the period under examination is the period 560 substantially corresponding with the transition end period 516, during which the signal 412 is weighted. It is further assumed that the digital-analog conversions and radio frequency modulations are carried out utilizing prior art techniques.

In the embodiment shown in FIG. 7, the signal source 410 comprises a digital signal source 710, a digital-analog converter 720 and a modulator 730. The digital signal source 710 may comprise e.g. a digital signal processor. At the digital signal source 710, a digital signal 712 is generated e.g. from the received signal 402, or the digital signal source 710 generates such a signal itself. In this embodiment, the effective value of the amplified signal 422 is modified by weighting the digital signal 712 at the digital signal source 710. A ramp table located e.g. in the memory of the digital signal source 710 can then be used. The weighted digital signal 712 is supplied to the digital-analog converter 720, at which the digital signal 712 is converted into an analog signal 714. Next, the analog signal 714 is, in accordance with the prior art, modulated to radio frequency at a modulator 730, and the generated radio-frequency signal 412 is amplified at the power amplifier 420.

In the embodiment of FIG. 8, a digital signal is generated at a digital signal source 810; from this signal, a real part 812*a* and a complex part 812*b* of the digital signal are formed. The real part 812*a* constitutes the I branch of the signal while the complex part 812*b* constitutes the Q branch thereof. The signal can be divided into the real part 812*a* and the complex part 812*b* e.g. at a signal processor of the digital signal source 810. Next, the effective value of the amplified signal 422 is modified by weighting the real part 812*a* and the complex part 812*b* of the digital signal at multipliers 804*a* and 804*b*, which can be implemented by separate circuits or at the digital signal source 810. The weighting can be carried out e.g. by the coefficients $W_i$ in the memory of the digital signal processor. In a preferred embodiment, the same weighting coefficients are used in the I and Q branches. The weighted real part 812*a* and the complex part 812*b* of the digital signal are each supplied to a separate digital-analog converter 820*a*, 820*b* to generate analog signals 813*a*, 813*b*. Next, the real part 813*a* and the complex part 813*b* of the analog signal are combined at an I/Q modulator 824, which simultaneously modulates the signal into a radio-frequency signal 812, which is amplified at the power amplifier 420.

In the embodiment shown in FIG. 9, the signal source 410 comprises a digital signal source 910, digital-analog converters 920*a*, 920*b*, an I/Q modulator 924 and a pre-amplifier 930. In this embodiment, the digital signal source 910 generates a digital signal which is divided into signals 912*a* and 912*b* of the I and Q branches, which are further converted into analog form at the analog-digital converters 920*a*, 920*b*. Next, the analog signals 913*a*, 913*b* are I/Q-modulated and modulated into a radio frequency at an I/Q modulator 924. The signal 916 thus generated is supplied to a pre-amplifier 930, whose amplification can be controlled.

In an embodiment, when the power of the signal 412 is weighted, the shape of the ramp is read from the memory of the control unit 280, and the signal 412 is converted into an analog signal by a digital-analog converter in order to control the amplification of the amplifier 930.

In an embodiment, an analog signal for controlling a preamplifier is generated at the preamplifier 930, in which case the power control command 448 comprises the pre-amplifier control signal in digital form, the digital-analog converters carrying out the conversion then being located at the pre-amplifier 930.

In another embodiment, the power control command 448 comprises an analog signal for controlling the weighting carried out by the amplifier 930 of the pre-amplifier 448.

In an embodiment, the ramping according to the present solution is implemented simultaneously with performing the normal power control of signal 412; for this purpose, the memory of the control unit 280 comprises special weighting coefficients. The shape of a so-called normal ramp associated with normal power control is then weighted by the above-mentioned coefficients $W_i$. Physically, this can be implemented by multiplying the coefficients of the normal ramp by weighting vector $W_i$, or simply by storing a new ramp or new ramps resulting from the multiplication in memory. In an embodiment, the coefficients $W_i$ may, in the time domain, also extend into the guard period 558. It is typical for a normal ramp to achieve its final value before the active period 556, whereas the ramp according to the present solution continues at the beginning of the active period 556. The ramp modified by the weighting coefficients then compensates for the limited rate of change of the operating voltage 450 of the power amplifier 420 supplied by the power source 440 in order to enable a situation shown in block 540 of FIG. 5 to be achieved. After weighting, the signal 412 undergoes a change into an amplified signal 422 at the power amplifier 420.

The weighting carried out on the analog signal shown in FIG. 9 can also be implemented in the embodiment according to FIG. 8. In such a case, pre-amplifiers 940 for weighting the signals 813*a* and 813*b* in accordance with FIG. 9 are arranged between the digital-analog converters 820*a*, 820*b* of both the I and Q branches and a modulator 824.

Although the invention has been described above with reference to the example in accordance with the accompanying drawings, it is obvious that the invention is not restricted thereto but can be modified in many ways within the inventive idea disclosed in the attached claims.

The invention claimed is:

1. A method for controlling signal power in a transmitter of a radio system, the method comprising:
   generating an amplified signal by amplifying a signal at a power amplifier; and
   changing the effective value of the amplified signal by modifying the operating voltage of the power amplifier and by weighting the signal as the operating voltage changes such that the effective value of the amplified signal remains within a predetermined value range.

2. A method as claimed in claim 1, further comprising changing the effective value of the amplified signal by modifying the operating voltage of the power amplifier and by weighting the signal such that the effective value of the amplified signal remains within a predetermined value range during an active period following a guard period.

3. A method as claimed in claim 1, further comprising changing the effective value of the amplified signal by modifying the operating voltage of the power amplifier to be of a predetermined value.

4. A method as claimed in claim 1, further comprising changing the effective value of the amplified signal by weighting the signal using predetermined weighting coefficients.

5. A method as claimed in claim 1, further comprising:
   receiving a power control command, and
   changing the effective value of the amplified signal on the basis of the power control command.

6. A method as claimed in claim 1, further comprising:
   generating a digital signal;
   changing the effective value of the amplified signal by weighting the digital signal;
   converting the weighted digital signal into an analog signal;
   modulating the analog signal into a radio frequency, and generating the amplified signal by amplifying the radio-frequency analog signal at the power amplifier.

7. A method as claimed in claim 1, further comprising:
   generating a digital signal;
   generating a real part and a complex part of the digital signal;
   changing the effective value of the amplified signal by weighting the real part and the complex part of the digital signal;

converting the weighted real part and the weighted complex part of the digital signal into analog signals;
combining the real part and the complex part of an analog signal in order to generate a combined analog signal;
modulating the combined analog signal into a radio frequency, and generating the amplified signal by amplifying the combined analog signal at the power amplifier.

8. A method as claimed in claim 1, further comprising:
generating a digital signal;
converting the digital signal into an analog signal;
modulating the analog signal into a radio frequency;
changing the effective value of the amplified signal by weighting the radio-frequency signal, and
generating the amplified signal by amplifying the weighted radio-frequency analog signal at the power amplifier.

9. A transmitter of a radio system, comprising:
a signal source for generating a signal;
a power amplifier connected to the signal source for generating an amplified signal from the signal;
a power source for providing an operating voltage for the power amplifier;
wherein the power source is configured to change the operating voltage of the power amplifier;
wherein the power amplifier is configured to change the amplification as the operating voltage of the power amplifier changes; and
wherein the signal source is configured to weight the signal as the amplification of the power amplifier changes such that the effective value of the amplified signal remains within a predetermined value range.

10. A transmitter as claimed in claim 9, wherein the signal source is configured to weight the signal such that the effective value of the amplified signal remains within a predetermined value range during an active period following a guard period.

11. A transmitter as claimed in claim 9, wherein the power source is configured to change the operating voltage of the power amplifier to be of a predetermined value.

12. A transmitter as claimed in claim 9, wherein the signal source is configured to weight the signal using predetermined weighting coefficients.

13. A transmitter as claimed in claim 9, wherein the power source is configured to receive a power control command;
wherein the signal source is configured to receive a power control command;
wherein the power source is configured to change the operating voltage of the power amplifier on the basis of the power control command; and
wherein the signal source is configured to weight the signal on the basis of the power control command.

14. A transmitter as claimed in claim 9, wherein the signal source is configured to generate a digital signal;
wherein the signal source is configured to weight the digital signal;
wherein the signal source further comprises a digital-analog converter for converting the weighted digital signal into an analog signal;
wherein the signal source further comprises a modulator for modulating the analog signal into a radio frequency; and
wherein the power amplifier is configured to amplify the radio-frequency analog signal.

15. A transmitter as claimed in claim 9, wherein the signal source (410) is configured to generate a digital signal;
wherein the signal source is configured to generate a real part and a complex part of the digital signal;
wherein the signal source is configured to weight the real part and the complex part of the digital signal;
wherein the signal source further comprises digital-analog converters for converting the real part of the digital signal into a real part of an analog signal and for converting the complex part of the digital signal into a complex part of the analog signal;
wherein the signal source further comprises a modulator for combining the real part and of the analog signal into a combined analog signal, and
wherein the signal source is configured to modulate the combined analog signal into a radio frequency.

16. A transmitter as claimed in claim 9, wherein the signal source is configured to generate a digital signal;
wherein the signal source further comprises digital-analog converters for converting a real part of the digital signal into a real part of an analog signal and for converting a complex part of the digital signal into a complex part of the analog signal;
wherein the signal source further comprises a modulator for combining the analog signals and for modulating the combined analog signal into a radio frequency; and
wherein the signal source further comprises a pre-amplifier for weighting an analog signal.

* * * * *